(12) United States Patent
Yamazaki et al.

(10) Patent No.: US 8,569,754 B2
(45) Date of Patent: Oct. 29, 2013

(54) SEMICONDUCTOR DEVICE AND MANUFACTURING METHOD THEREOF

(75) Inventors: Shunpei Yamazaki, Tokyo (JP); Yusuke Nonaka, Kanagawa (JP); Takatsugu Omata, Kanagawa (JP); Tatsuya Honda, Kanagawa (JP); Akiharu Miyanaga, Tochigi (JP); Hiroki Ohara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/285,385

(22) Filed: Oct. 31, 2011

(65) Prior Publication Data

US 2012/0112184 A1    May 10, 2012

(30) Foreign Application Priority Data

Nov. 5, 2010  (JP) ................ 2010-248840

(51) Int. Cl.
*H01L 29/12*    (2006.01)
(52) U.S. Cl.
USPC ............... 257/43; 257/57; 257/E29.296
(58) Field of Classification Search
USPC ............ 257/43, E29.296, E29.095, E29.096, 257/57, 59; 438/104, 603, 608, 609
See application file for complete search history.

(56) References Cited

U.S. PATENT DOCUMENTS

| | | | |
|---|---|---|---|
| 5,009,766 A | 4/1991 | Lauks | |
| 5,162,901 A | 11/1992 | Shimada et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,624,864 B1 | 9/2003 | Kubo et al. | |

(Continued)

FOREIGN PATENT DOCUMENTS

| EP | 1 737 044 A1 | 12/2006 |
|---|---|---|
| EP | 2 226 847 A2 | 9/2010 |

(Continued)

OTHER PUBLICATIONS

Po-Tsun Liu et al.; "Nitrogenated amorphous InGaZnO thin film transistor", Applied Physics Letters; Jan. 31, 2011; pp. 052102-1-052102-3; vol. 98, No. 5.

(Continued)

*Primary Examiner* — Matthew W Such
*Assistant Examiner* — Scott Stowe
(74) *Attorney, Agent, or Firm* — Fish & Richardson P.C.

(57) ABSTRACT

A semiconductor device having a novel structure or a method for manufacturing the semiconductor device is provided. For example, the reliability of a transistor which is driven at high voltage or large current is improved. For improvement of the reliability of the transistor, a buffer layer is provided between a drain electrode layer (or a source electrode layer) and an oxide semiconductor layer such that the end portion of the buffer layer is beyond the side surface of the drain electrode layer (or the source electrode layer) when seen in a cross section, whereby the buffer layer can relieve the concentration of electric field. The buffer layer is a single layer or a stacked layer including a plurality of layers, and includes, for example, an In—Ga—Zn—O film containing nitrogen, an In—Sn—O film containing nitrogen, an In—Sn—O film containing SiOx, or the like.

41 Claims, 9 Drawing Sheets

(56) References Cited

U.S. PATENT DOCUMENTS

| | | |
|---|---|---|
| 6,667,537 B1 | 12/2003 | Koike et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,129,523 B2 | 10/2006 | Yamazaki et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,368,045 B2 | 5/2008 | Vereecken et al. |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,432,529 B2 | 10/2008 | Yamazaki et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,521,269 B2 | 4/2009 | Song |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,795,050 B2 | 9/2010 | Song |
| 7,859,187 B2 | 12/2010 | Yamazaki et al. |
| 7,868,410 B2 | 1/2011 | Vereecken et al. |
| 7,902,740 B2 | 3/2011 | Sakakura et al. |
| 7,964,918 B2 | 6/2011 | Kanegae et al. |
| 8,174,029 B2 | 5/2012 | Yamazaki et al. |
| 8,222,805 B2 | 7/2012 | Zhang et al. |
| 8,232,552 B2 | 7/2012 | Yano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0111663 A1 | 6/2003 | Yagi |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0227150 A1 | 11/2004 | Nakahara |
| 2005/0017302 A1 | 1/2005 | Hoffman |
| 2005/0199959 A1 | 9/2005 | Chiang et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0046336 A1 | 3/2006 | Shoji et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0192204 A1 | 8/2006 | Yamaguchi et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Covan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258174 A1 | 10/2008 | Seong |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025675 A1 | 2/2010 | Yamazaki et al. |
| 2010/0025676 A1 | 2/2010 | Yamazaki et al. |
| 2010/0025677 A1 | 2/2010 | Yamazaki et al. |
| 2010/0025678 A1 | 2/2010 | Yamazaki et al. |
| 2010/0025679 A1 | 2/2010 | Yamazaki et al. |
| 2010/0032665 A1 | 2/2010 | Yamazaki et al. |
| 2010/0032666 A1 | 2/2010 | Yamazaki et al. |
| 2010/0032667 A1 | 2/2010 | Yamazaki et al. |
| 2010/0032668 A1 | 2/2010 | Yamazaki et al. |
| 2010/0035379 A1 | 2/2010 | Miyairi et al. |
| 2010/0051938 A1 | 3/2010 | Hayashi et al. |
| 2010/0051949 A1 | 3/2010 | Yamazaki et al. |
| 2010/0065844 A1 | 3/2010 | Tokunaga |
| 2010/0072468 A1 | 3/2010 | Yamazaki et al. |
| 2010/0078633 A1 | 4/2010 | Watanabe |
| 2010/0084648 A1 | 4/2010 | Watanabe |
| 2010/0084655 A1 | 4/2010 | Iwasaki et al. |
| 2010/0092800 A1 | 4/2010 | Itagaki et al. |
| 2010/0109002 A1* | 5/2010 | Itagaki et al. .................. 257/43 |
| 2010/0109003 A1 | 5/2010 | Akimoto et al. |
| 2010/0109058 A1 | 5/2010 | Sakata et al. |
| 2010/0117078 A1 | 5/2010 | Kuwabara et al. |
| 2010/0127253 A1* | 5/2010 | Inoue et al. .................. 257/43 |
| 2010/0133530 A1 | 6/2010 | Akimoto et al. |
| 2010/0140609 A1 | 6/2010 | Yano et al. |
| 2010/0163867 A1 | 7/2010 | Yamazaki et al. |
| 2010/0193783 A1 | 8/2010 | Yamazaki et al. |
| 2010/0216285 A1 | 8/2010 | Yokoi et al. |
| 2010/0219410 A1 | 9/2010 | Godo et al. |
| 2010/0264412 A1 | 10/2010 | Yamazaki et al. |
| 2011/0006302 A1 | 1/2011 | Yamazaki et al. |
| 2011/0115763 A1 | 5/2011 | Yamazaki et al. |
| 2012/0001169 A1 | 1/2012 | Yamazaki |
| 2012/0097941 A1 | 4/2012 | Yamazaki |
| 2012/0097942 A1 | 4/2012 | Imoto et al. |

(56) References Cited

U.S. PATENT DOCUMENTS

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-123861 A | 5/2007 |
| JP | 2010-056539 A | 3/2010 |
| WO | 2004/114391 A1 | 12/2004 |

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

(56) References Cited

OTHER PUBLICATIONS

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds $InMO_3(ZnO)m$ (M=in,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$-$Ga_2ZnO_4$-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed.using single-crystalline $InGaO_3(ZnO)5$ films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)m$ (m<4):a $Zn4s$ conductor," Philosophical Magazine, 2001, vol. 81, No. 5, pp. 501-515.

Orita, M et al., "Mechanism of Electrical Conductivity of Transparent $InGaZnO4$," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size Amoled." AM-FPD '08 Digest of Technical Papers, Jul. 2, 2008, pp. 275-278.

Park, S et al., "Challenge to Future Displays: Transparent AM-OLED Driven by PEALD Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo ($Ga_2O_3$-$In_2O_3$-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

SEMICONDUCTOR DEVICE AND MANUFACTURING METHOD THEREOF

BACKGROUND OF THE INVENTION

1. Field of the Invention

An embodiment of the present invention relates to a semiconductor device including a transistor or including a circuit including a transistor. For example, an embodiment of the present invention relates to a semiconductor device including a transistor in which a channel formation region is formed using an oxide semiconductor or including a circuit including such a transistor.

2. Description of the Related Art

A technique for manufacturing a transistor or the like using an oxide semiconductor film for a channel formation region to apply to a display device has been attracting attention. Examples of such a transistor include a transistor in which zinc oxide (ZnO) is used as an oxide semiconductor film and a transistor in which $InGaO_3(ZnO)_m$ is used as an oxide semiconductor film. A technique for manufacturing such a transistor including an oxide semiconductor film over a light-transmitting substrate to apply to a switching element or the like of an image display device is disclosed in Patent Documents 1 and 2.

An inverted staggered (bottom-gate) transistor in which an oxide semiconductor film containing In, Ga, and Zn is used as a semiconductor layer and buffer layers using a metal oxide are provided between the semiconductor layer and a source and drain electrode layers is disclosed in Patent Document 3. In this transistor, an ohmic contact is formed by intentionally providing the metal oxide layers as the buffer layers between the semiconductor layer and the source and drain electrode layers.

REFERENCE

Patent Document 1: Japanese Published Patent Application No. 2007-123861
Patent Document 2: Japanese Published Patent Application No. 2007-096055
Patent Document 3: Japanese Published Patent Application No. 2010-056539

SUMMARY OF THE INVENTION

There are various modes for display devices; in the field of liquid crystal display devices, a blue-phase liquid crystal has been attracting attention. In addition, in display devices called electronic paper, a medium which can electrically control the contrast (also called electronic ink or the like) is used. Further, self-luminous display devices using electroluminescent materials have been put to practical use. For such new display modes, a transistor used in a display device is expected to have a higher withstand voltage.

Further, it is preferable that a channel be formed at a positive threshold voltage which is as close to 0 V as possible in a transistor used in a display device. If the threshold voltage of the transistor is negative, the transistor tends to be in a so-called normally-on state, in which current flows between the source electrode and the drain electrode even when the gate voltage is 0 V. As for an active-matrix display device, electric characteristics of a transistor included in a circuit are important, and performance of the display device depends on the electric characteristics. In particular, of the electric characteristics of the transistor, the threshold voltage ($V_{th}$) is important. When the threshold voltage value is negative even when the field effect mobility is high, it is difficult to control as the circuit. Such a transistor in which a channel is formed even at a negative voltage so that a drain current flows is not suitable as a transistor used in a circuit.

In view of the above, it is an object of an embodiment of the present invention to provide a semiconductor device having a novel structure or a method for manufacturing the semiconductor device.

It is an object of an embodiment of the present invention to provide a semiconductor device including a structure of a transistor whose threshold voltage value is positive as a so-called normally-off switching element.

Further, it is preferable to achieve the characteristics of a transistor close to the normally-off characteristics even when the transistor is not a normally-off transistor depending on the material or the manufacturing condition. It is an object of an embodiment of the present invention to provide a structure for achieving a threshold voltage of a transistor close to zero even when the threshold voltage is negative, that is, even when the transistor is a so-called normally-on transistor, and to provide a manufacturing method thereof.

Further, it is an object of an embodiment of the present invention to improve the reliability of a transistor which is driven at high voltage or large current.

One embodiment of the present invention is a semiconductor device including an oxide semiconductor layer, a buffer layer in contact with the oxide semiconductor layer, a source electrode layer or a drain electrode layer which overlaps with the oxide semiconductor layer with the buffer layer provided therebetween, a gate insulating layer in contact with the oxide semiconductor layer, and a gate electrode layer which overlaps with the oxide semiconductor layer with the gate insulating layer provided therebetween. The gate electrode layer has a stacked-layer structure in which one layer which is in contact with the gate insulating layer is a metal oxide containing nitrogen. The buffer layer is a metal oxide containing nitrogen.

As the one layer of the gate electrode layer, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. These films each have a work function of 5 eV or higher, preferably 5.5 eV or higher, which enables the threshold voltage of the electrical characteristics of the transistor to be positive when being used as the gate electrode layer. Accordingly, a so-called normally-off switching element can be provided.

Further, in order to improve the reliability of the transistor, the buffer layer is provided such that the end portion of the buffer layer is (or extends) beyond the side surface of the drain electrode layer (or the source electrode layer) when seen in a cross section, whereby the buffer layer can relieve the concentration of electric field.

A material used for the oxide semiconductor layer preferably contains at least indium (In) or zinc (Zn). In particular, In and Zn are preferably contained. In addition, as a stabilizer for reducing the variation in electric characteristics of a transistor using the oxide, it is preferable to further contain gallium (Ga). Tin (Sn) is preferably contained as the stabilizer. Hafnium (Hf) is preferably contained as the stabilizer. Aluminum (Al) is preferably contained as the stabilizer.

Alternatively or in addition, as the stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide (also referred to as ITZO), a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

The oxide semiconductor may be either single crystal or non-single-crystal. In the latter case, the oxide semiconductor may be either amorphous or polycrystal. Further, the oxide semiconductor may have either a structure in which a crystal portion is included in an amorphous portion or a non-amorphous structure.

The buffer layer is a single layer or a stacked layer including a plurality of layers, and includes, for example, an In—Ga—Zn—O film containing nitrogen, an In—Sn—O film containing nitrogen, an In—Sn—O film containing SiOx, or the like. The resistance of the buffer layer can be set as appropriate by adjusting the content of nitrogen in the case of an In—Ga—Zn—O film containing nitrogen, and by adjusting the content of SiOx in the case of an In—Sn—O film containing SiOx. Further, since the buffer layer overlaps with the oxide semiconductor layer for forming a channel formation region, the resistance of the buffer layer can also be adjusted by adjusting the thickness of the buffer layer.

Further, the light transmittance of the buffer layer is lower than that of the oxide semiconductor layer. With the use of an In—Ga—Zn—O film containing nitrogen as the buffer layer, light irradiation to the region of the oxide semiconductor layer, which overlaps with the buffer layer, can be prevented since the light transmittance of the In—Ga—Zn—O film containing nitrogen is lower than that of an In—Ga—Zn—O film and has light blocking properties. Further, in the case of using an In—Ga—Zn—O film containing nitrogen as the buffer layer, the concentration of nitrogen in the buffer layer is set to be higher than that of nitrogen in the oxide semiconductor layer which is in contact with the buffer layer.

The buffer layer overlaps with the gate electrode layer with the oxide semiconductor layer and the gate insulating layer provided therebetween, at least partly.

It is preferable that the gate electrode layer be a stacked layer using aluminum, copper, or the like in at least one layer. In the case where copper is used for one layer of the gate electrode layer, the process temperature after the formation of the gate electrode layer is set to be lower than or equal to 450° C.

In the case where aluminum is used for one layer of the gate electrode layer, the process temperature after the formation of the gate electrode layer is set to be higher than or equal to 250° C. and lower than or equal to 380° C., preferably higher than or equal to 300° C. and lower than or equal to 350° C. Further, in the case where aluminum is used as a material of the gate electrode layer, an oxide (e.g., alumina) might be formed on the surface of the aluminum in contact with an oxide film, and therefore, tantalum nitride or titanium nitride is used for a barrier layer.

The gate electrode layer is preferably a stacked layer in which an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (e.g., InN or SnN) is stacked between the barrier layer and the gate insulating layer. When at least one layer in the stacked layers of the gate electrode layer is formed using the same material as the buffer layer, a same sputtering target (A sputtering target can also be simply referred to as a "target") can be used, leading to reduction in manufacturing cost.

The gate insulating layer can be formed employing a single-layer structure or a stacked-layer structure using any of a silicon oxide, a silicon nitride, a silicon oxynitride, a silicon nitride oxide, a gallium oxide, an aluminum oxide, an aluminum nitride, an aluminum oxynitride, an aluminum nitride oxide, or a hafnium oxide, or a combination thereof by a plasma CVD method, a sputtering method, or the like. Considering the function as a gate insulating layer of a transistor, a material having a high dielectric constant such as a hafnium oxide, a tantalum oxide, an yttrium oxide, a hafnium silicate ($HfSi_xO_y$ (x>0, y>0)), a hafnium aluminate ($HfAl_xO_y$ (x>0, y>0)), a hafnium silicate to which nitrogen is added, or a hafnium aluminate to which nitrogen is added may be used. A sputtering method is preferable in terms of low possibility of entry of hydrogen, water, and the like.

In the case where the oxide semiconductor layer is crystallized, a material which matches the crystal structure of the oxide semiconductor layer is preferably used as a material for the gate insulating layer which is in contact with the oxide semiconductor layer or a passivation layer which is in contact with the oxide semiconductor layer; it is preferable to use a Ga—Zn—O film or an α—$Ga_2O_3$ film having a hexagonal crystal structure, so that the crystal of the oxide semiconductor layer can match the crystal of the gate insulating layer or the passivation layer continuously. For example, it is preferable that a transistor have a stacked-layer structure in which an oxide semiconductor layer is provided on and in contact with a first Ga—Zn—O film, and a second Ga—Zn—O film is provided on and in contact with the oxide semiconductor layer.

According to one embodiment of the present invention, the threshold voltage value of a transistor can be made to be positive, whereby a so-called normally-off switching element can be realized. Further, according to one embodiment of the present invention, the threshold voltage of a normally-on transistor can be made to be close to zero. Further, according to one embodiment of the present invention, the reliability of a transistor which is driven at high voltage or large current can be improved.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

Figure 1A:
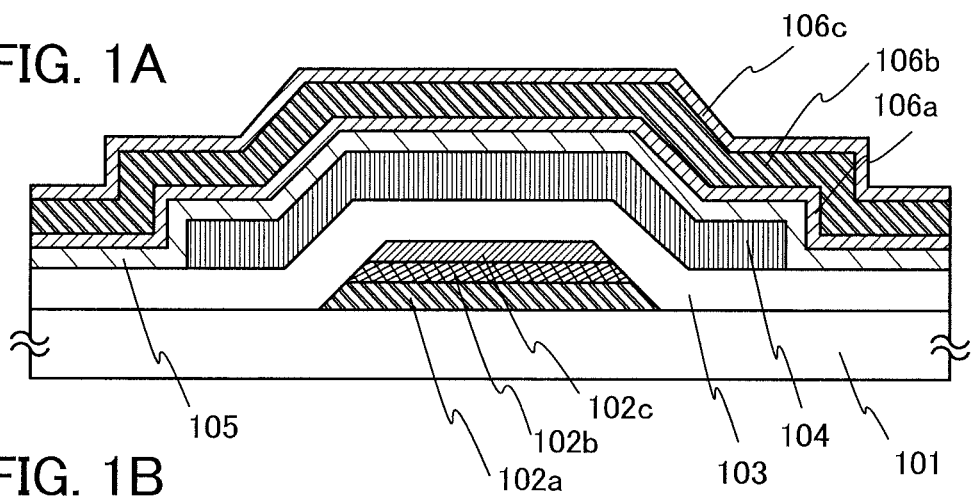
FIGS. 1A to 1C are cross-sectional views illustrating a manufacturing process of one embodiment of the present invention.
Figure 1B:
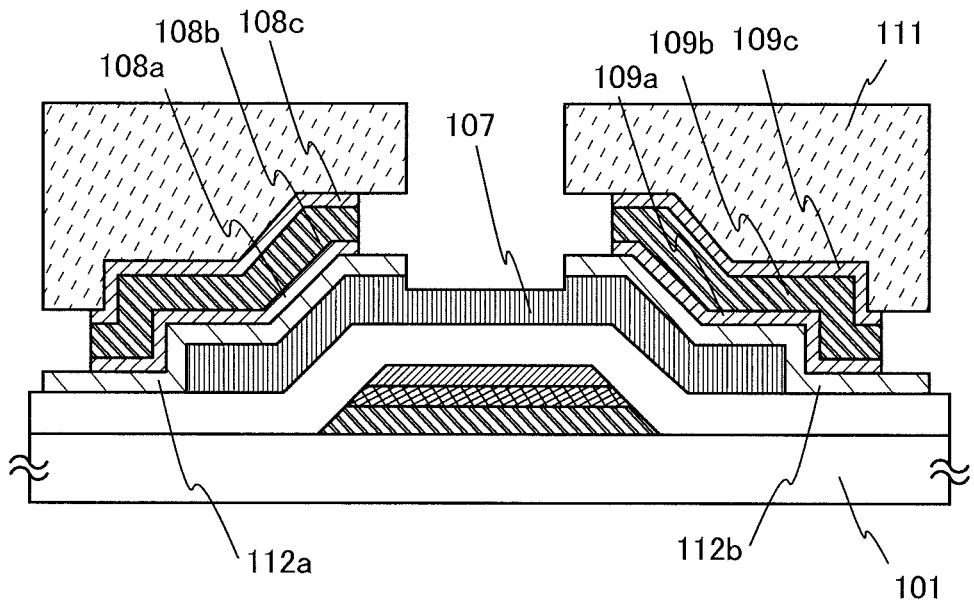
Figure 1C:
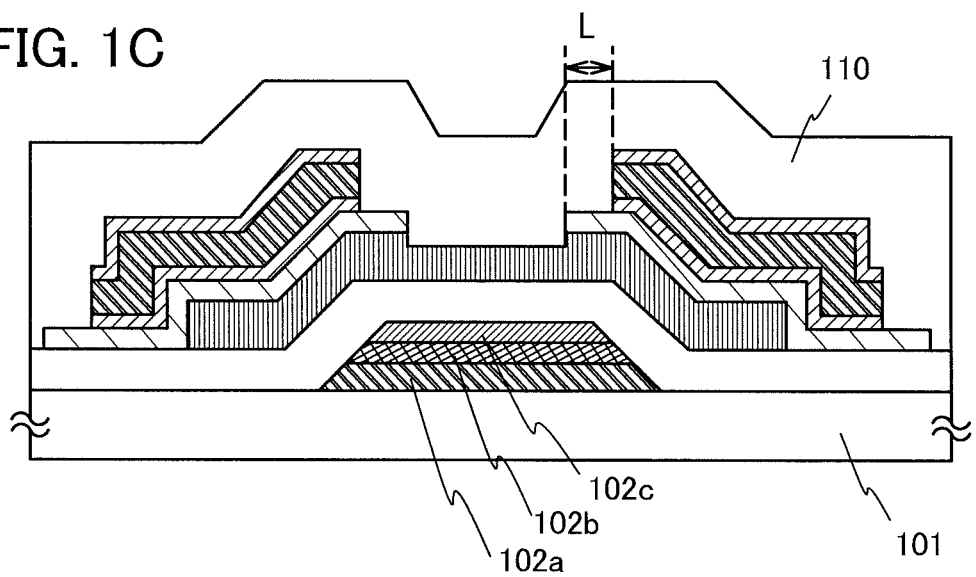

In this embodiment, an example of manufacturing a transistor over a substrate is described using FIGS. 1A to 1C.

First, a conductive film including three layers whose materials are different from one another is formed over a substrate 101, a resist mask is formed over the conductive film with a first photomask, and etching is performed selectively thereon, whereby a gate electrode layer is formed. After that, the resist mask is removed. If necessary, a base insulating film of a silicon oxide, a silicon nitride, a silicon oxynitride, a silicon nitride oxide, or the like may be provided ahead of formation of the conductive film.

As a material of the substrate 101, a glass material such as aluminosilicate glass, aluminoborosilicate glass, or barium borosilicate glass can be used. In the mass production, a mother glass with the following size is preferably used for the substrate 101: the 8-th generation (2160 mm×2460 mm); the 9-th generation (2400 mm×2800 mm, or 2450 mm×3050 mm); the 10-th generation (2950 mm×3400 mm); or the like. High process temperature and a long period of process time drastically shrink the mother glass. Thus, in the case where mass production is performed with use of the mother glass, it is preferable that the heat process in the manufacturing process be performed at a temperature lower than or equal to 600° C., further preferably lower than or equal to 450° C.

Instead of the above glass substrate, a substrate formed of an insulator such as a ceramic substrate, a quartz substrate, or a sapphire substrate may be used as the substrate 101. Alternatively, crystallized glass or the like may be used. Further alternatively, a substrate obtained by forming an insulating layer over a surface of a semiconductor substrate such as a silicon wafer or a surface of a conductive substrate formed of a metal material can be used.

As a first electrode layer 102a, a low-resistant conductive film, specifically, an aluminum film or a copper film, or an alloy film in which one or more elements selected from titanium (Ti), tantalum (Ta), tungsten (W), molybdenum (Mo), chromium (Cr), neodymium (Nd), and scandium (Sc) is combined with the aforementioned film can be used.

As a second electrode layer 102b, a metal nitride film which functions as a barrier layer, for example, a titanium nitride, a tantalum nitride, a tungsten nitride, a molybdenum nitride, a chromium nitride, or the like can be used.

As a third electrode layer 102c, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (InN, SnN, or the like) can be used. These films as the third electrode layer 102c each have a work function of 5 eV or higher, preferably 5.5 eV or higher; thus, the threshold voltage of the electrical characteristics of the transistor can be made to be positive, so that a so-called normally-off switching element can be realized. This is a point different from a transistor using silicon. The threshold value of an n-channel transistor using silicon is shifted to be positive by using an element which imparts p-type conductivity for a gate electrode or by doping silicon with a slight amount of an impurity element which imparts p-type conductivity. On the other hand, the threshold voltage of such a transistor using an In—Ga—Zn—O film for a semiconductor layer can be shifted to be positive by forming a gate electrode containing nitrogen.

In this embodiment, an In—Ga—Zn—O film containing nitrogen is used. The deposition conditions thereof are as follows: a target for an oxide semiconductor (manufactured by Mitsui Mining & Smelting Co., Ltd.) containing $In_2O_3$, $Ga_2O_3$, and ZnO at 2:2:1 [molar ratio] is used; the distance between the substrate and the target (also called a T-S distance) is greater than or equal to 40 mm less than or equal to 300 mm; the pressure is 0.4 Pa to 0.6 Pa; the flow rate of argon gas is 0 sccm to 175 sccm; the flow rate of nitrogen gas is 25 sccm to 200 sccm; the power is 1 kW to 5 kW; and the substrate temperature is higher than or equal to 80° C. and lower than 450° C. The resistance of the In—Ga—Zn—O film containing nitrogen can be decreased by heat treatment; thus heat treatment may be performed if necessary to reduce the resistance. However, in the case where aluminum is used as the first electrode layer 102a, the temperature of the heat treatment is lower than or equal to 380° C.; in the case where copper is used as the first electrode layer 102a, the temperature of the heat treatment is lower than or equal to 450° C. The In—Ga—Zn—O film containing nitrogen is polycrystalline and includes a c-axis orientation, and the crystallinity thereof is high. Further, the work function of an In—Ga—Zn—O film containing nitrogen which was deposited as a single film by a sputtering method where the flow rate of nitrogen gas was 40 sccm was 5.6 eV according to the measurement.

Figure 9:
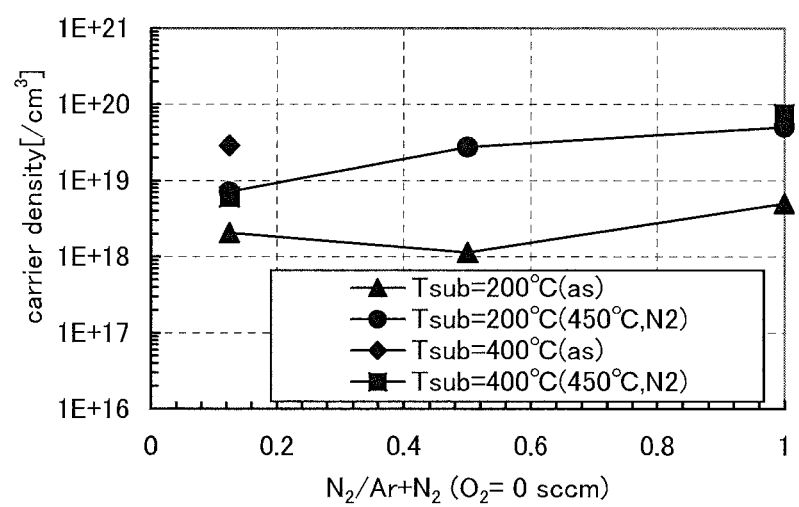
FIG. 9 is a graph showing results of Hall measurement.

Further, the Hall effects of a sample of an as-depo 300-nm-thick In—Ga—Zn—O film containing nitrogen over a quartz substrate and a sample of a 300-nm-thick In—Ga—Zn—O film containing nitrogen over a quartz substrate, subjected to heat treatment under a nitrogen atmosphere at 450° C. for one hour were measured (Hall effect measurement system: ResiTest 8300, manufactured by TOYO Corporation). Results thereof are shown in FIG. 9. The vertical axis in the graph of FIG. 9 indicates the carrier concentration and the horizontal axis indicates the rate of nitrogen gas with respect to the whole film deposition gas. It can be seen from FIG. 9 that the carrier concentration is increased as the rate of nitrogen gas with respect to the whole film deposition gas increases. Also, the carrier type of the In—Ga—Zn—O film containing nitrogen is an n-type.

Further, according to the measurement, the work function of an In—O film containing nitrogen which was deposited as a single film by a sputtering method where the flow rate of nitrogen gas was 40 seem was 5.4 eV; the work function of an In—Sn—O film containing nitrogen which was deposited as a single film by a sputtering method where the flow rate of nitrogen gas was 40 seem was 5.5 eV; the work function of an In—Ga—O film containing nitrogen which was deposited as a single film by a sputtering method where the flow rate of nitrogen gas was 40 sccm was 5.4 eV; the work function of an In—Zn—O film containing nitrogen which was deposited as a single film by a sputtering method where the flow rate of nitrogen gas was 40 sccm was 5.5 eV; the work function of a Sn—O film containing nitrogen which was deposited as a single film by a sputtering method where the flow rate of nitrogen gas was 40 sccm was 5.1 eV.

Next, a gate insulating layer 103 covering the gate electrode layer is formed. The thickness of the gate insulating layer 103 be greater than or equal to 10 nm and less than or equal to 300 nm.

The gate insulating layer 103 can be formed to employ a single-layer structure or a stacked-layer structure using silicon oxide, silicon nitride, silicon oxynitride, silicon nitride oxide, gallium oxide, zing gallium oxide (also called GZO), aluminum oxide, aluminum nitride, aluminum oxynitride, aluminum nitride oxide, hafnium oxide, or a combination thereof by a plasma CVD method, a sputtering method, or the like. For example, a silicon oxynitride layer may be formed by a plasma CVD method using $SiH_4$, oxygen, and nitrogen as a deposition gas.

Next, an oxide semiconductor film is formed over the gate insulating layer 103.

The oxide semiconductor film is formed with a thickness of greater than or equal to 5 nm and less than or equal to 50 pin by a sputtering method or the like with the use of a metal oxide target containing at least zinc under an atmosphere of only oxygen or a mix of argon and oxygen. As a typical example of the metal oxide target, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, a two-component metal oxide such as an In—Zn—O-based metal oxide or a Sn—Zn—O-based metal oxide can be used.

Further, in order to shift the threshold voltage of electrical characteristics of a transistor in a positive direction, a slight amount of nitrogen may be mixed in the oxide semiconductor film to decrease the Fermi level ($E_F$). In the case where a slight amount of nitrogen is mixed in the oxide semiconductor film, the nitrogen concentration in the oxide semiconductor film is set to be lower than that of a buffer layer formed later.

In addition, at the formation of the oxide semiconductor film, the pressure of a treatment chamber in a sputtering apparatus is set to 0.4 Pa or less, whereby mixing of an impurity such as alkali metal or hydrogen to an object or a surface of the object can be suppressed. Hydrogen may be contained in the object in the form of a hydrogen molecule, water, a hydroxyl group, or hydride as well as in the form of a hydrogen atom.

Further, in the formation of the oxide semiconductor film, the distance between the target and the substrate (T-S distance) is set to greater than or equal to 40 mm and less than or equal to 300 mm (preferably, greater than or equal to 60 mm).

In addition, in the formation of the oxide semiconductor film by a sputtering method, the temperature of the surface on which the film is deposited is higher than or equal to 250° C., preferably lower than or equal to the upper limit of the heat treatment temperature for the substrate. A temperature at which entry of impurities such as water or hydrogen into a film to be formed is prevented and the impurity is released to a vapor phase in the chamber is 250° C. In addition, the upper limit of the temperature of the surface on which a film is deposited by a sputtering method is the upper limit of the heat treatment temperature for the substrate or the upper limit of the temperature of the film to be formed (if the temperature exceeds the latter upper limit, components in the film significantly change).

Moreover, in the formation of the oxide semiconductor film, the leakage rate of the treatment chamber of the sputtering apparatus is suppressed to less than or equal to $1\times10^{-10}$ Pa·m³/second, entry of an impurity such as an alkali metal or hydride into the oxide semiconductor film in the deposition by a sputtering method can be reduced. Further, with the use of an entrapment vacuum pump (e.g., a cryopump) as an evacuation system, counter flow of an impurity such as an alkali metal, a hydrogen atom, a hydrogen molecule, water, a hydroxyl group, or hydride from the evacuation system can be reduced.

The gate insulating layer 103 and the oxide semiconductor film are preferably formed in succession without exposure to the air. With the successive formation, the interface of the stacked layers can be formed without being contaminated by atmospheric component or contamination impurities floating in the air.

After the oxide semiconductor film is formed, if necessary, heat treatment may be performed in an atmosphere which contains less hydrogen and moisture (a nitrogen atmosphere, an oxygen atmosphere, a dry-air atmosphere (for example, as for moisture, a dew point is lower than or equal to −40° C., preferably lower than or equal to −60° C.), or the like) (at a temperature higher than or equal to 200° C. and lower than or equal to 450° C.). This heat treatment can be called dehydration or dehydrogenation, which is for detaching H, OH, or the like from the oxide semiconductor layer. In the case where the temperature is raised in an inert atmosphere and the atmosphere is switched to an atmosphere containing oxygen during the heat treatment, or in the case where an oxygen atmosphere is employed in the heat treatment, such heat treatment can also be called treatment for supplying oxygen.

Next, a resist mask is formed using a second photomask over the oxide semiconductor film, and etching is performed selectively thereon to form an island-shaped oxide semiconductor layer 104. After that, the resist mask is removed.

Next, a buffer layer 105, a first conductive film 106a, a second conductive film 106b, and a third conductive film 106c are formed over the island-shaped oxide semiconductor layer 104. A cross-sectional view at this stage is FIG. 1A.

As the buffer layer 105, an In—Ga—Zn—O film containing nitrogen, an In—Sn—O film containing nitrogen, or the like can be used.

Such an In—Ga—Zn—O film containing nitrogen which can be used for the buffer layer 105 or part of the gate electrode layer has film characteristics which are greatly different from those of the In—Ga—Zn—O film which is used for the oxide semiconductor layer. In this specification, the "In—Ga—Zn—O film" means a film deposited with oxygen gas introduced into a chamber at the time of deposition using a target for an In—Ga—Zn—O-based oxide semiconductor.

Figure 2A:
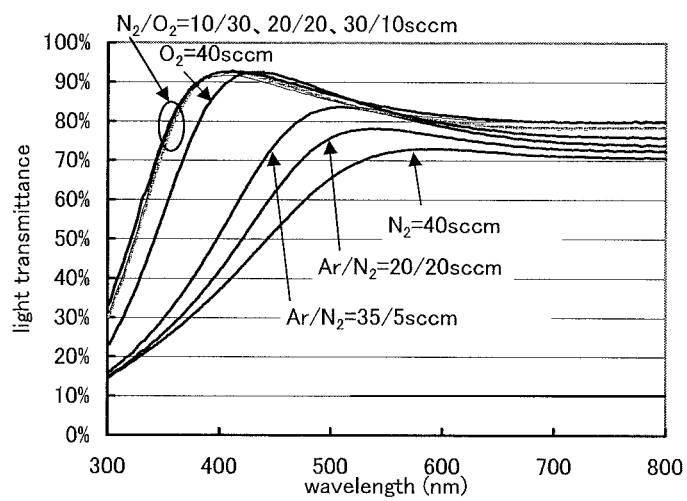
FIGS. 2A and 2B are graphs showing the light transmittance.
Figure 2B:
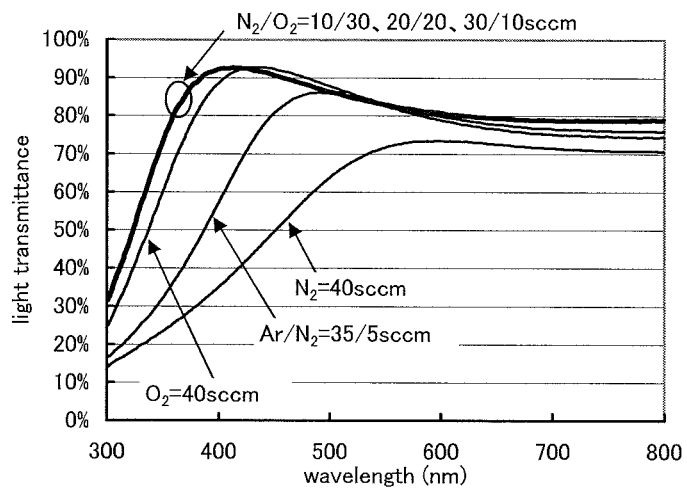

FIGS. 2A and 2B show the light transmittances of an In—Ga—Zn—O film and an In—Ga—Zn—O film containing nitrogen which were actually deposited.

Samples in FIG. 2A were deposited with a thickness of 100 nm over a 0.5-mm-thick quartz glass in the following conditions: a target for an oxide semiconductor (manufactured by Mitsui Mining & Smelting Co., Ltd.) containing $In_2O_3$, $Ga_2O_3$, and ZnO at 2:2:2 [molar ratio] was used; the T-S distance was 60 mm; the pressure was 0.4 Pa; the power was 500 W; and the substrate temperature was 200° C. In FIG. 2A, the condition of the deposition gas flow rate was changed. The flow rates of argon gas and nitrogen gas were 35 sccm and 5 sccm, respectively in Sample 1; the flow rates of argon gas and nitrogen gas were 20 sccm and 20 sccm, respectively in Sample 2; the flow rate of nitrogen gas was 40 sccm in Sample 3; the flow rate of oxygen gas was 40 sccm in Sample 4; the flow rates of oxygen gas and nitrogen gas were 30 sccm and 10 sccm, respectively in Sample 5; the flow rates of oxygen gas and nitrogen gas were 20 sccm and 20 sccm, respectively in Sample 6; the flow rates of oxygen gas and nitrogen gas were 10 sccm and 30 sccm, respectively in Sample 7.

FIG. 2B shows the light transmittances of Samples which were deposited at a substrate temperature of 400° C. Samples in FIG. 2B were deposited with a thickness of 100 nm over a 0.5-mm-thick quartz glass in the following conditions: a target for an oxide semiconductor (manufactured by Mitsui Mining & Smelting Co., Ltd.) containing $In_2O_3$, $Ga_2O_3$, and ZnO at 2:2:2 [molar ratio] was used; the T-S distance was 60 mm; the pressure was 0.4 Pa; and the power was 500 W. The flow rates of argon gas and nitrogen gas were 35 seem and 5 sccm, respectively in Sample 1'; the flow rate of nitrogen gas was 40 sccm in Sample 3'; the flow rate of oxygen gas was 40 sccm in Sample 4'; the flow rates of oxygen gas and nitrogen gas were 20 sccm and 20 sccm, respectively in Sample 6'.

As shown in FIGS. 2A and 2B, an In—Ga—Zn—O film deposited with oxygen gas introduced into a chamber at the time of deposition exhibits high light transmittance and is a nearly transparent film. On the other hand, an In—Ga—Zn—O film deposited with not oxygen gas but nitrogen introduced into a chamber at the time of deposition is a brown film and has light blocking properties.

Further, these samples were subjected to heat treatment in a nitrogen atmosphere at 450° C. for one hour; as a result, the light transmittances were not changed so much. Further, a sample which was deposited in the same conditions as Sample 1 was measured by thermal desorption spectroscopy (TDS), according to which a thermal desorption spectrum of $H_2O$ molecules (M/z=18) desorbed from the film were shown in FIG. 3A. The measurement conditions were as follows: the temperature rise was about 30° C. per minute, and the vacuum level was $1 \times 10^{-8}$ (Pa) at the start of the measurement and was about $1 \times 10^{-7}$ (Pa) during the measurement.

Figure 3A:
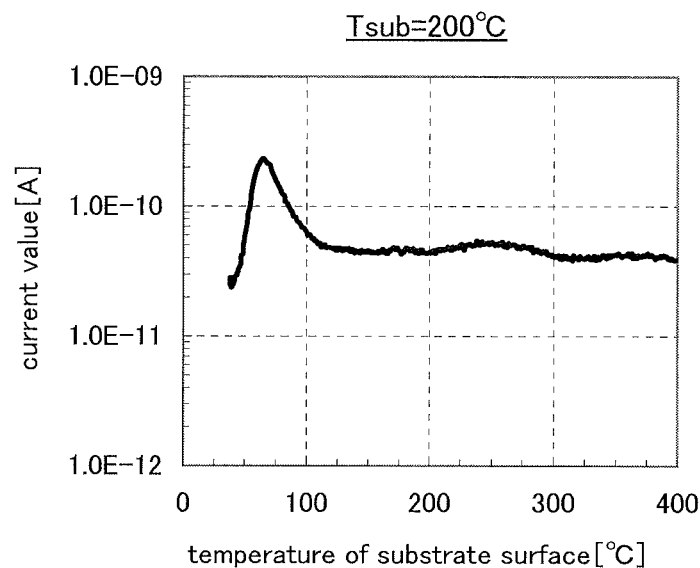
FIGS. 3A and 3B are graphs showing TDS measurement results.
Figure 3B:
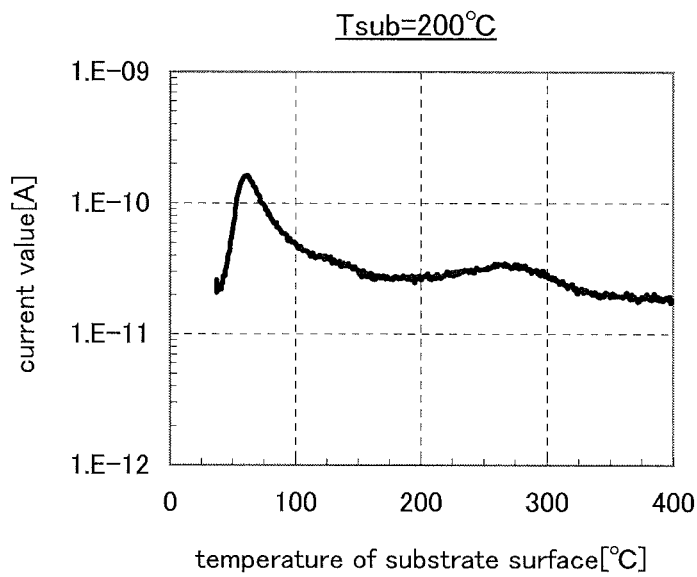

In addition, an In—Ga—Zn—O film (thickness: 50 nm) deposited in such conditions that the flow rates of oxygen gas and nitrogen gas were 15 sccm and 30 sccm, respectively and the substrate temperature was 200° C. was measured as Sample 8 by TDS, according to which a thermal desorption spectrum of $H_2O$ molecules desorbed from the film were quantified as shown in FIG. 3B.

FIGS. 3A and 3B show that almost the same amount of $H_2O$ is desorbed at the same substrate temperature and the heat stability of the films are almost the same degree. Further, through not shown, results of $N_2$ molecules of Sample 1 measured by TDS were almost the same as those of $N_2$ molecules of Sample 1 measured by TDS after Sample 1, the In—Ga—Zn—O film containing nitrogen, was subjected to heat treatment at 450° C. for one hour in a nitrogen atmosphere.

Figure 8A:
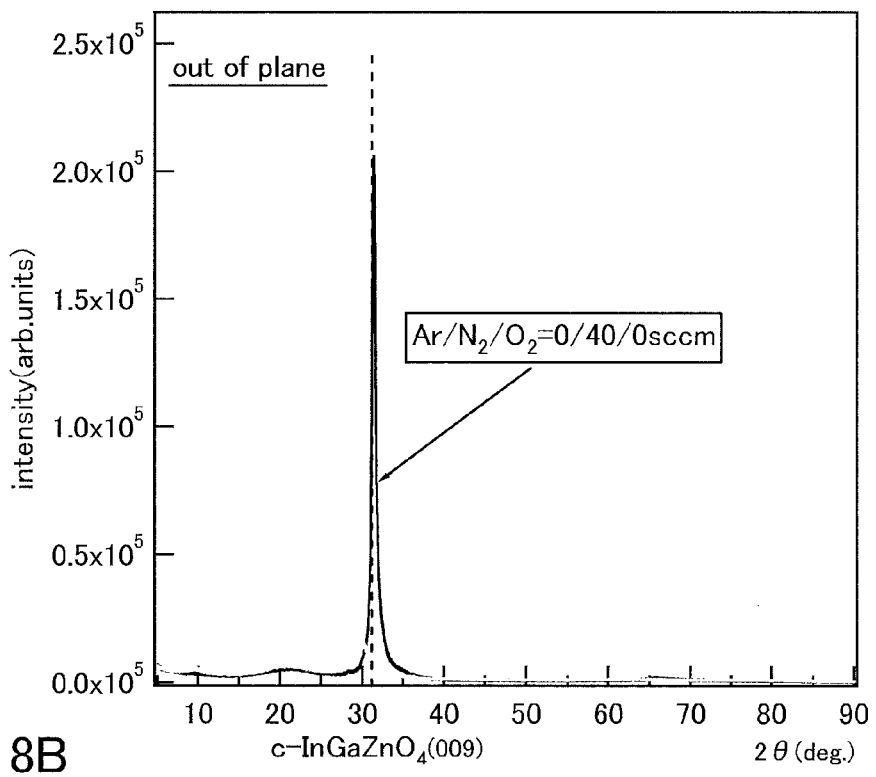
FIGS. 8A and 8B are graphs showing XRD measurement results.
Figure 8B:
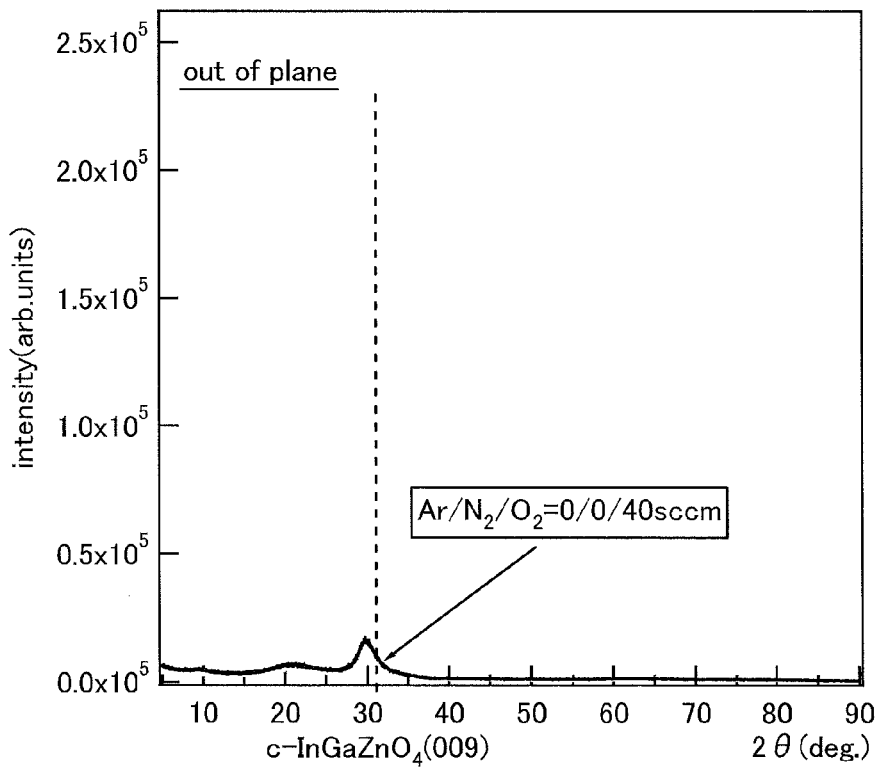

Further, the out-of-plane XRD measurement was performed on Sample 9 with a thickness of 300 nm deposited over a quartz substrate in such conditions that the substrate temperature was 400° C. and the flow rate of nitrogen gas was 40 sccm and Sample 10 with a thickness of 300 nm deposited over a quartz substrate in such conditions that the substrate temperature was 400° C. and the flow rate of oxygen gas was 40 sccm, results of which are shown in FIGS. 8A and 8B. The In—Ga—Zn—O film containing nitrogen (Sample 9) has high crystallinity in an as-depo state and exhibits a sharp peak in FIG. 8A. In addition, it is found that the crsyatllinity of the In—Ga—Zn—O film deposited using only oxygen gas as a sputtering gas (Sample 10) is lower than that of Sample 9. As described above, the film quality is greatly different between an In—Ga—Zn—O film and an In—Ga—Zn—O film containing nitrogen in an as-depo state.

Next, a resist mask 111 is formed using a third photomask over the third conductive film 106c, and etching is performed selectively thereon, so that a source electrode layer 108a to 108c and a drain electrode layer 109a to 109c are formed. Such etching conditions are employed for this etching that the side surfaces of the resist mask 111 are not aligned with any of the etched side surface of the source electrode layer 108a to 108c and the etched side surface of the drain electrode layer 109a to 109c when seen in the cross section.

Then, with the resist mask 111, the buffer layer is etched selectively to form a first buffer layer 112a and a second buffer layer 112b. In the same etching step, an oxide semiconductor layer 107 having a concave portion is formed.

A cross-sectional view at this stage is FIG. 1B. The first buffer layer 112a has a cross-sectional shape which is beyond the side surface of the source electrode layer 108a to 108c, and the second buffer layer 112b has a cross-sectional shape which is beyond the side surface of the drain electrode layer 109a to 109c. One embodiment of the present invention is not limited to the etching order described in this embodiment as long as the same cross section as FIG. 1B can be provided.

After that, the resist mask 111 is removed.

Next, an insulating layer 110 is formed. The insulating layer 110 functions as a passivation layer. A cross-sectional view at this stage is FIG. 1C.

The insulating layer 110 can be formed by a plasma CVD method, a sputtering method, or the like, employing a single-layer structure or a stacked-layer structure using a silicon oxide, a silicon nitride, a silicon oxynitride, a silicon nitride oxide, a gallium oxide, a zing gallium oxide, an aluminum oxide, an aluminum nitride, an aluminum oxynitride, an aluminum nitride oxide, a hafnium oxide, or a combination thereof. For example, a silicon oxynitride layer may be formed by a plasma CVD method using $SiH_4$, oxygen, and nitrogen as a deposition gas.

In this manner, a transistor shown in FIG. 1C can be formed using three photomasks. Furthermore, for the application as a switching element of a display device, a contact hole reaching the gate electrode layer or the drain electrode layer may be formed in the insulating layer 110, and a pixel electrode may be formed over the insulating layer 110. In that case, a fourth photomask is used for formation of the contact hole, and a fifth photomask is used for formation of the pixel electrode; thus, five photomasks are used in total.

In the transistor, the first buffer layer 112a whose side surface is beyond the side surface of the source electrode layer 108a to 108c and the second buffer layer 112b whose side surface is beyond the side surface of the drain electrode layer 109a to 109c are provided, and the concentration of electric field is relieved by the buffer layers.

The length L in the channel length direction in a region of the buffer layer which is out of the side surface of the drain electrode layer (or the source electrode layer) can be adjusted as appropriate by an etching condition or the like. The length L in the channel length direction in the region of the buffer layer is a horizontal distance from the bottom edge portion of the drain electrode layer 109a to 109c (or the source electrode layer 108a to 108c) to the bottom edge portion of the second buffer layer 112b (or the first buffer layer 112a).

The resistivity of the tapered portion of the buffer layer which is the region for relieving electric-field concentration may be, though it depends on the thickness of the region or the length (L) in the channel length direction, adjusted by, for example, selecting the material or setting the thickness of the buffer layer, or designing the size of the tapered portion as appropriate. At least the resistivity of the tapered portion of the buffer layer is set to be lower than that of the channel formation region in the oxide semiconductor layer 107.

Embodiment 2

In this embodiment, an example of manufacturing a transistor and a pixel electrode with four photomasks in total which is smaller than the number of photomasks in Embodiment 1 by one is described using FIG. 4 and FIGS. 5A to 5D. In this embodiment, the manufacturing of the transistor is different from Embodiment 1 just in part thereof; thus, detailed description of the same portion is omitted in this embodiment.

Figure 4:
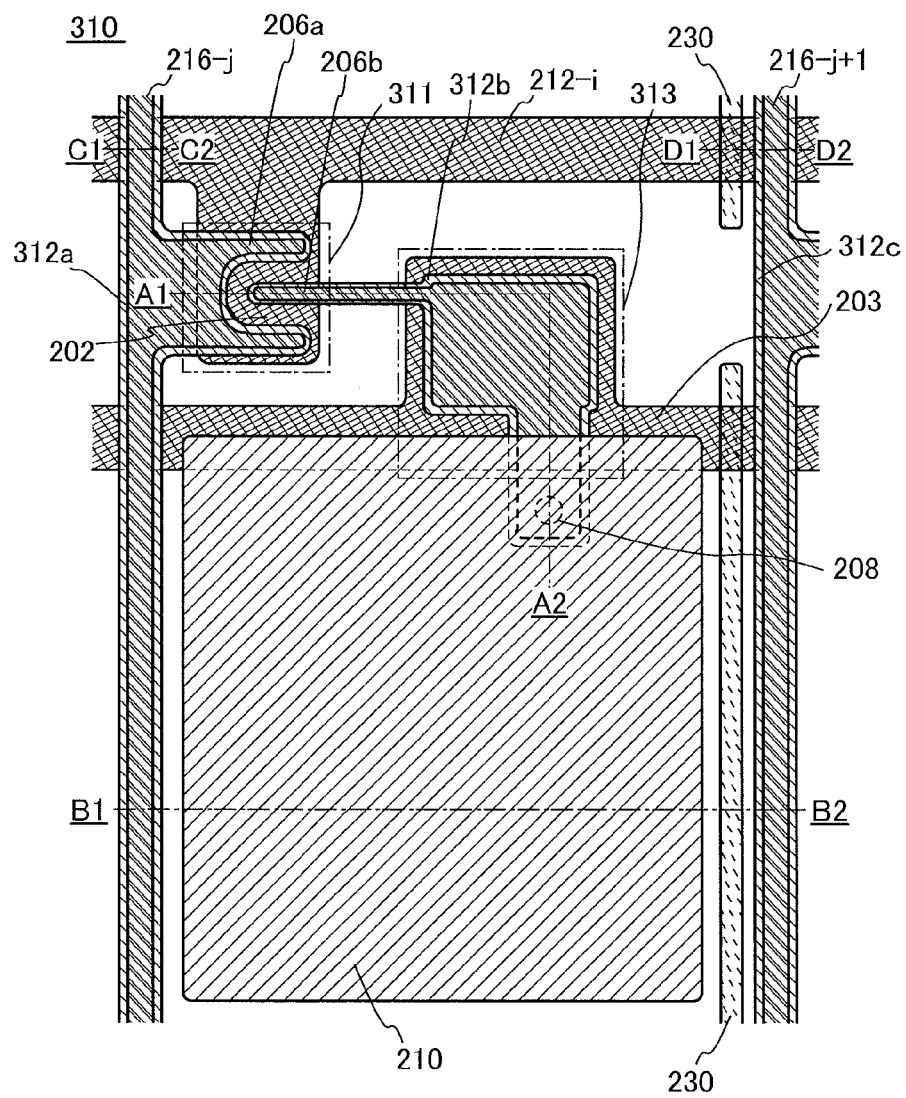
FIG. 4 is a plan view of a pixel, illustrating one embodiment of the present invention.

FIG. 4 is a top view illustrating a plan structure of a pixel 310, and FIGS. 5A to 5D are cross-sectional views illustrating a stacked-layer structure of the pixel 310. Chain lines A1-A2, B1-B2, C1-C2, and D1-D2 in FIG. 4 correspond to cross sections A1-A2, B1-B2, C1-C2, and D1-D2 in FIGS. 5A to 5D, respectively.

In a transistor 311 described in this embodiment, a drain electrode layer 206b is partly surrounded by a U-shaped (C-shaped or horseshoe-shaped) source electrode layer 206a. With such a shape, a sufficient channel width can be ensured even when the area of the transistor is small, which enables the amount of current flowing at the time when the transistor is turned on (the current also referred to as the on-state current) to be increased.

A wiring 203 serves as a capacitor electrode or a capacitor wiring. In this embodiment, the wiring 203 overlaps with the drain electrode layer 206b, whereby a capacitor 313 is formed.

Further, in a semiconductor device described in this embodiment, the second photomask in Embodiment 1 is not used and neither a photolithography step nor an etching step for forming an island-shaped oxide semiconductor layer are performed in order to simplify the manufacturing process, which results in that the oxide semiconductor layer 205 remains in the entire pixel region, which leads to formation of a parasitic transistor in which a wiring 212-i functions as a three-layer gate electrode layer, a wiring 216-j functions as one of a source electrode layer and a drain electrode layer, and a wiring 216-j+1 functions as the other of the source electrode layer and the drain electrode layer.

In view of the above, according to this embodiment, a groove portion 230 in which the oxide semiconductor layer 205 is removed is provided in the pixel 310 so that the above-described parasitic transistor is not formed. The groove portion 230 is provided so as to cross the wiring 212-i in the line width direction of the wiring 212-i across both the edges thereof; accordingly, formation of the parasitic transistor can be prevented. In addition, the groove portion 230 is provided so as to cross the wiring 203 in the line width direction of the wiring 203 across both the edges thereof; accordingly, formation of the other parasitic transistor(s) can be prevented. The number of groove portions 230 over the wiring 212-i and number of groove portions 230 over the wiring 203 each are limited to one. Further, the groove portion 230 is not necessarily provided in parallel to the wiring 216-j or the wiring 216-j+1 and may have a flection portion or a bending portion.

The cross section A1-A2 shows stacked-layer structures of the transistor 311 and the capacitor 313. The transistor 311 is a bottom gate transistor. The cross section B1-B2 shows stacked-layer structures from the wiring 216-j to the wiring 216-j+1, including a pixel electrode 210 and the groove portion 230. Further, the cross section C1-C2 shows a stacked-layer structure at an intersection of the wiring 216-j and the wiring 212-i. The cross section D1-D2 shows a stacked-layer structure at an intersection of the wiring 216-j+1 and the wiring 212-i and a stacked-layer structure of the groove portion 230.

Figure 5A:
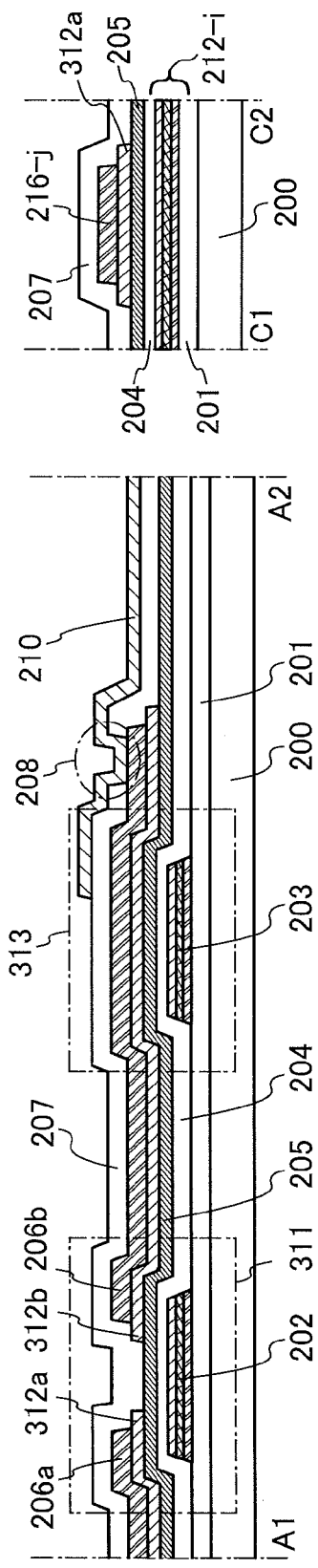
FIGS. 5A to 5D are cross-sectional views of a pixel, illustrating one embodiment of the present invention.

In the cross section A1-A2 in FIG. 5A, a base insulating layer 201 is formed over a substrate 200, and a gate electrode layer 202 and the wiring 203 are formed over the base insulating layer 201. Over the gate electrode layer 202 and the wiring 203, a gate insulating layer 204 and the oxide semiconductor layer 205 are formed. Over the oxide semiconductor layer 205, buffer layers 312a and 312b, the source electrode layer 206a and the drain electrode layer 206b are formed. Further, an insulating layer 207 is formed over the source electrode layer 206a and the drain electrode layer 206b so as to be in contact with part of the oxide semiconductor layer 205. The pixel electrode 210 is formed over the insulating layer 207, and electrically connected to the drain electrode layer 206b through a contact hole 208 formed in the insulating layer 207.

Figure 5C:
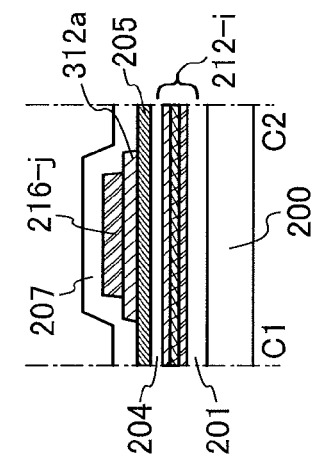
Figure 5B:
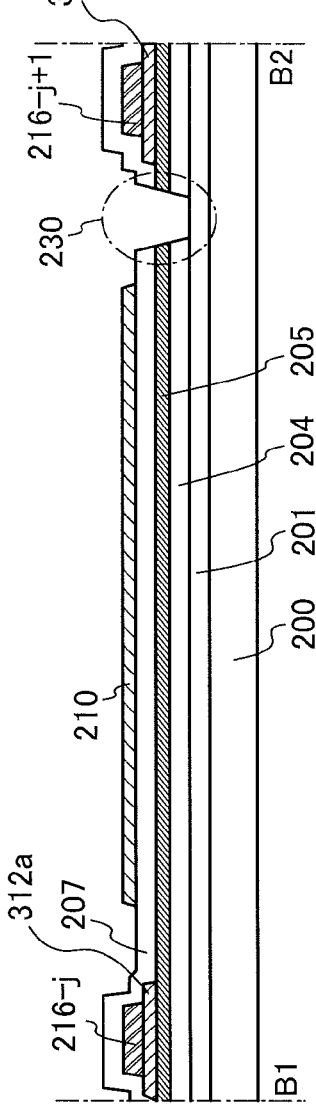

In the cross section B1-B2 in FIG. 5B, the base insulating layer 201 is formed over the substrate 200, the gate insulating layer 204 is formed over the base insulating layer 201, and the oxide semiconductor layer 205 is formed over the gate insulating layer 204. The buffer layer 312a and a buffer layer 312c are formed over the oxide semiconductor layer 205, the wiring 216-j is formed over the buffer layer 312a, the wiring 216-j+1 is formed over the buffer layer 312c, and the insulating layer 207 is formed over the oxide semiconductor layer 205, the buffer layers 312a and 312c, the wiring 216-j, and the wiring 216-j+1. Further, over the insulating layer 207, the pixel electrode 210 is formed.

In the cross section C1-C2 in FIG. 5C, the base insulating layer 201 is formed over the substrate 200, and the wiring 212-i is formed over the base insulating layer 201. Further, the gate insulating layer 204 and the oxide semiconductor layer 205 are formed over the wiring 212-i. Further, the buffer layer 312a is formed over the oxide semiconductor layer 205, the wiring 216-j is formed over the buffer layer 312a, and the insulating layer 207 is formed over the wiring 216-j.

Figure 5D:
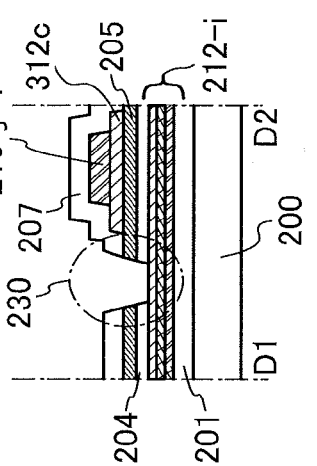

In the cross section D1-D2 in FIG. 5D, the base insulating layer 201 is formed over the substrate 200, and the wiring 212-i is formed over the base insulating layer 201. The wiring 212-i includes three layers; in this embodiment, a copper film, a tungsten nitride film, and an In—Ga—Zn—O film containing nitrogen are stacked in this order. Further, the gate insulating layer 204 and the oxide semiconductor layer 205 are formed over the wiring 212-i. Further, the buffer layer 312c is formed over the oxide semiconductor layer 205, the wiring 216-j+1 is formed over the buffer layer 312c, and the insulating layer 207 is formed over the wiring 216-j+1. In this embodiment, an In—Sn—O film containing SiOx is used as the buffer layer 312c. In addition, part of the gate insulating layer 204, part of the oxide semiconductor layer 205, and part of the insulating layer 207 are removed to form the groove portion 230.

The groove portion 230 is formed using the same photomask as the photomask used for forming the contact hole 208 in the insulating layer 207. A contact hole reaching the gate electrode layer is also formed using the same photomask, though not shown.

Further, the oxide semiconductor layer 205 has sufficient light-transmitting properties, and thus does not particularly matter in a light-transmissive liquid crystal display device even when the oxide semiconductor layer 205 overlaps with the pixel electrode 210. For example, an In—Ga—Zn—O film deposited with oxygen gas introduced has high light-transmitting properties as shown in FIGS. 2A and 2B, and thus is appropriate as a material for the oxide semiconductor layer 205.

The semiconductor device of this embodiment can be manufactured using four photomasks in total: a first photomask used for formation of the gate electrode layer; a second photomask used for formation of the buffer layer, and the source and drain electrode layers; a third photomask used for formation of the contact hole and the grove portion; and a fourth photomask used for formation of the pixel electrode.

In the case where a liquid crystal display device is manufactured using a pixel including the transistor shown in FIG. 4 and FIGS. 5A to 5D, a counter substrate is attached to the substrate 200, and a liquid crystal layer is provided therebetween. In the case of the color filter system, a color filter or a black matrix is provided between the pixel electrode and a backlight. In the case of the field sequential system, a plurality of light sources which exhibit different colors (for example, R (red), G (green), and B (blue)) is used and the emission time of light is divided for each color, whereby an appropriate color is exhibited.

A liquid crystal exhibiting a blue phase for which an alignment film is unnecessary may be used for the liquid crystal layer. A blue phase is one of liquid crystal phases, which is generated just before a cholesteric phase changes into an isotropic phase while the temperature of cholesteric liquid crystal is increased. Since the blue phase is only generated within a narrow range of temperature, a chiral agent or an ultraviolet curable resin is added so that the temperature range is improved. The liquid crystal composition which includes a liquid crystal exhibiting a blue phase and a chiral agent is preferable because it has a small response time greater than or equal to 10 μsec and less than or equal to 100 μsec, has optical isotropy, which makes the alignment process unneeded, and has a small viewing angle dependence.

In the case where an organic light-emitting display device is manufactured using the transistor shown in FIG. 4 and FIGS. 5A to 5D, two or more transistors are provided in a pixel, and an organic light-emitting element whose cathode or anode is the pixel electrode which is electrically connected at least to one of the transistors is formed. In that case, a bank formed using an insulator is provided between the pixel electrodes which are adjacent to each other; thus, the organic light-emitting display device can be manufactured using five photomasks in total including one photomask for patterning of the bank.

Embodiment 3

Figure 6A:
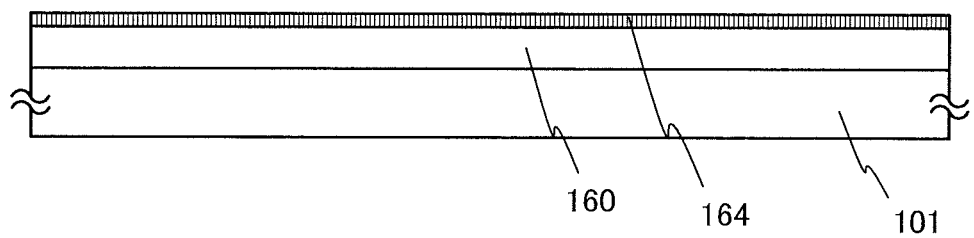
FIGS. 6A to 6C are cross-sectional views illustrating a manufacturing process of one embodiment of the present invention.
Figure 6B:
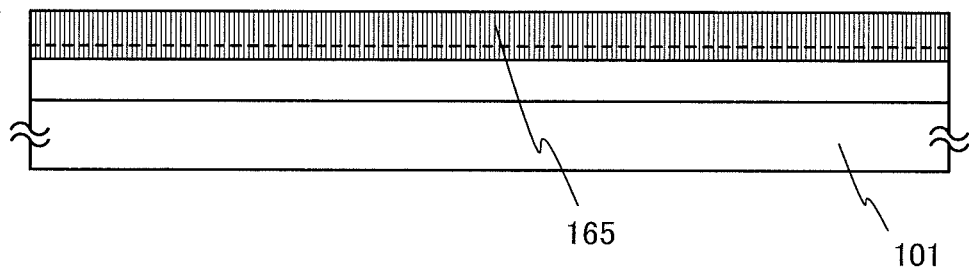
Figure 6C:
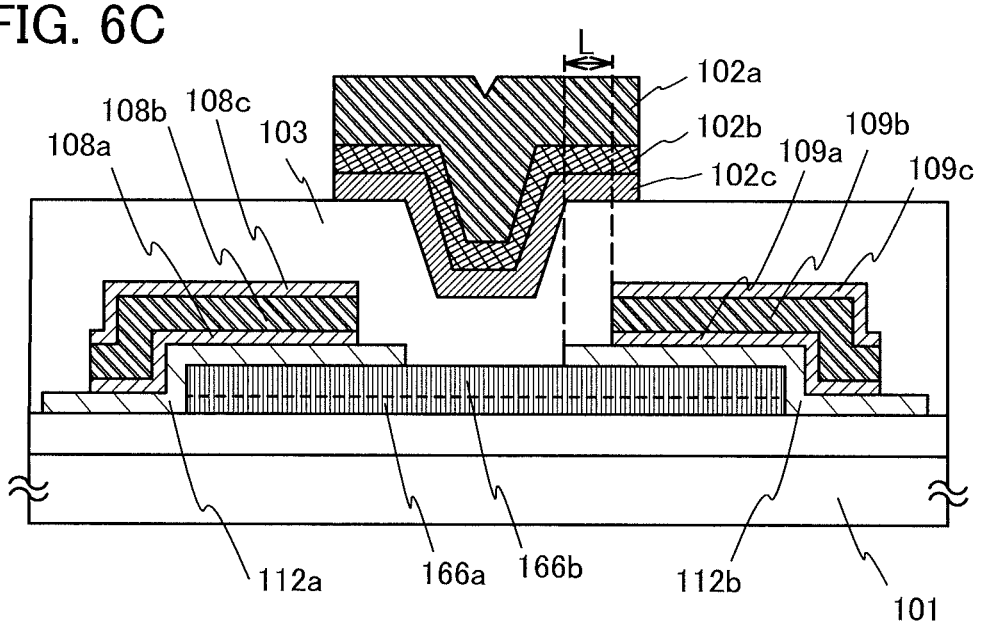

Described in Embodiments 1 and 2 are an example of a bottom gate transistor. In this embodiment, an example of manufacturing a top gate transistor is described. In FIGS. 6A to 6C, the same portions as those shown in FIGS. 1A to 1C are denoted by the same reference numerals.

Further, according to this embodiment, an oxide semiconductor layer is formed by deposition two times.

First, an oxide insulating film 160 which serves as a base insulating layer is formed over a substrate 101.

The oxide insulating film 160 is formed using an oxide insulating film from which part of oxygen is released by heat treatment. The oxide insulating film which contains oxygen over the stoichiometric proportion is preferably used as the oxide insulating film from which part of oxygen is released by heat treatment. With the oxide insulating film from which part of oxygen is released by heat treatment, oxygen can be diffused into a crystalline oxide semiconductor film by heat treatment. Typical examples of the oxide insulating film 160 are films of a silicon oxide, a silicon oxynitride, a silicon nitride oxide, an aluminum oxide, an aluminum oxynitride, a gallium oxide, a hafnium oxide, an yttrium oxide, and the like.

It is preferable to use a Ga—Zn—O film or an α—$Ga_2O_3$ film having a hexagonal crystal structure as the oxide insulating film 160 because the crystal of an oxide semiconductor layer can match the crystal of the oxide insulating layer 160 which is the base insulating layer continuously.

The thickness of the oxide insulating film 160 is greater than or equal to 50 nm, preferably greater than or equal to 200 nm and less than or equal to 500 nm. With the thick oxide insulating film 160, the amount of oxygen released from the oxide insulating film 160 can be increased, and defects at the interface between the oxide insulating film 160 and the oxide semiconductor film formed later can be reduced.

The oxide insulating film 160 is formed by a sputtering method, a CVD method, or the like. The oxide insulating film from which part of oxygen is released by heat treatment is preferably formed by a sputtering method for easy formation.

Next, a first oxide semiconductor film is formed to a thickness greater than or equal to 1 nm and less than or equal to 10 nm over the oxide insulating film 160.

In this embodiment, the first oxide semiconductor film having a thickness of 5 nm is formed under an oxygen atmosphere or an atmosphere including argon and oxygen in the following conditions: a target for an oxide semiconductor (a target for an In—Ga—Zn—O-based oxide semiconductor including $In_2O_3$, $Ga_2O_3$, and ZnO at 1:1:2 [molar ratio]) is used; the distance between the substrate and the target is 170 mm; the substrate temperature is 250° C.; the pressure is 0.4 Pa; and the direct current (DC) power is 0.5 kW.

Next, first heat treatment is performed under a chamber atmosphere of nitrogen (in which the dew point of moisture is less than or equal to −50° C., preferably less than or equal to −60° C.) or a dry air (in which the dew point of moisture is less than or equal to −50° C., preferably less than or equal to −60° C.) where the substrate is disposed. The temperature of the first heat treatment is higher than or equal to 350° C. and lower than or equal to 750° C. In addition, heating time of the first heat treatment is longer than or equal to 1 minute and shorter than or equal to 24 hours. Through the first heat treatment, a first crystalline oxide semiconductor layer 164 is formed (see FIG. 6A).

Next, a second oxide semiconductor film with a thickness greater than 10 nm is formed over the first crystalline oxide semiconductor layer 164.

In this embodiment, the second oxide semiconductor film is formed to a thickness of 25 nm under an oxygen atmosphere or an atmosphere containing argon and oxygen under the following conditions: a target for an oxide semiconductor (target for an In—Ga—Zn—O-based oxide semiconductor including $In_2O_3$, $Ga_2O_3$, and ZnO at 1:1:2 [molar ratio]) is used; the distance between the substrate and the target is 170 mm; the substrate temperature is 400° C.; the pressure is 0.4 Pa; and the direct current (DC) power is 0.5 kW.

Next, second heat treatment is performed under a chamber atmosphere of nitrogen (in which the dew point of moisture is less than or equal to −50° C., preferably less than or equal to −60° C.) or a dry air (in which the dew point of moisture is less than or equal to −50° C., preferably less than or equal to −60° C.) where the substrate is disposed. The temperature of the second heat treatment is higher than or equal to 350° C. and lower than or equal to 750° C. In addition, heating time of the second heat treatment is longer than or equal to 1 minute and shorter than or equal to 24 hours. Through the second heat treatment, a second crystalline oxide semiconductor layer 165 is formed (see FIG. 6B). In FIG. 6B, the interface between the first crystalline oxide semiconductor layer 164 and the second crystalline oxide semiconductor layer 165 is indicated by a dotted line, and the first crystalline oxide semiconductor layer 164 and the second crystalline oxide semiconductor layer 165 are illustrated as a stack of oxide semiconductor layers; however, the interface is actually not distinct and is illustrated just for easy understanding.

The first crystalline oxide semiconductor layer 164 and the second crystalline oxide semiconductor layer 165 have neither a single crystal structure nor an amorphous structure and are crystalline oxide semiconductors at least part of which is crystallized to have c-axis alignment (also referred to as c-axis aligned crystalline oxide semiconductor (CAAC-OS)).

It is preferable that the steps from and including the formation step of the oxide insulating film 160 to and including the step of the second heat treatment be performed successively without exposure to the air. Further, in order to promote crystallization of the stack of the oxide semiconductor layers, nitrogen may be introduced into the deposition chamber using an oxygen gas canister containing a slight amount of nitrogen or an argon gas canister containing a slight amount of nitrogen in the deposition of the first oxide semiconductor layer and/or the second oxide semiconductor layer.

Next, the stack of oxide semiconductor layers including the first crystalline oxide semiconductor layer 164 and the second crystalline oxide semiconductor layer 165 is processed into an island-shaped stack of oxide semiconductor layers.

The process of the stack of oxide semiconductor layers can be performed as follows: a mask having an appropriate shape is formed using a first photomask over the stack of oxide semiconductor layers, and then the stack of oxide semiconductor layers is etched using the mask. The mask may be formed by photolithography, an ink-jet method, or the like.

For the etching of the stack of oxide semiconductor layers, either wet etching or dry etching may be employed. It is needless to say that both of them may be employed in combination.

Next, a buffer layer, a first conductive film, a second conductive film, and a third conductive film are formed over the stack of oxide semiconductor layers. The buffer layer, the first conductive film, the second conductive film, and the third conductive film are formed according to Embodiment 1.

Next, a mask is formed using a second photomask over the third conductive film, and etching is performed selectively thereon, so that a source electrode layer 108a to 108c and a drain electrode layer 109a to 109c are formed. The etching condition for this etching is set so as not to align the side surfaces of the resist mask with any of the etched side surface of the source electrode layer 108a to 108c and the etched side surface of the drain electrode layer 109a to 109c when seen in the cross section.

Then, with the same resist mask, the buffer layer is selectively etched to form a first buffer layer 112a and a second buffer layer 112b. After that, the resist mask is removed.

Next, a gate insulating layer 103 which covers the source electrode layer 108a to 108c and the drain electrode layer 109a to 109c and is in contact with the stack of oxide semiconductor layers is formed. It is preferable to use a Ga—Zn—O film or an α—Ga$_2$O$_3$ film having a hexagonal crystal structure as the gate insulating layer 103 because the crystal of an oxide semiconductor layer can match the crystal of the gate insulating layer 103 continuously.

Next, a third electrode layer 102c is formed over a gate insulating layer 103, a second electrode layer 102b is formed thereover, and a first electrode layer 102a is formed thereover. In this embodiment, for showing the correspondence with the stacked layer of the gate electrode layer in FIG. 1A, the same reference symbol is used for the same material as that in FIG. 1A.

As the third electrode layer 102c over and in contact with the gate insulating layer 103, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, a metal nitride film (InN, SnN, or the like) can be used as is in Embodiment 1.

Through the above process, a top gate transistor is formed (see FIG. 6C). In the transistor, the first buffer layer 112a whose side surface is protruded from the side surface of the source electrode layer 108a to 108c and the second buffer layer 112b whose side surface is protruded from the side surface of the drain electrode layer 109a to 109c are provided, and the concentration of electric field is relieved by the buffer layers.

The length L in the channel length direction in a region of the buffer layer which is out of the side surface of the drain electrode layer (or the source electrode layer) can be adjusted as appropriate by an etching condition or the like. The length L in the channel length direction in the region of the buffer layer is a horizontal distance from the bottom edge portion of the drain electrode layer 109a to 109c (or the source electrode layer 108a to 108c) to the bottom edge portion of the second buffer layer 112b (or the first buffer layer 112a).

The resistivity of the tapered portion of the buffer layer which is the region for relieving electric-field concentration may be, though it depends on the thickness of the region or the length (L) in the channel length direction, adjusted by, for example, selecting the material or setting the thickness of the buffer layer, or designing the size of the tapered portion as appropriate. At least the resistivity of the tapered portion of the buffer layer is set to be lower than that of the channel formation region in the oxide semiconductor layer 166a and the oxide semiconductor layer 166b.

As for the stack of oxide semiconductor layers according to this embodiment, not the entire stack is single crystal, but the stack is a non-single-crystal layer with c-axis alignment in the direction perpendicular to the surface of the stack of oxide semiconductor layers, in which a plurality of crystals are included but a-b planes thereof are not aligned with each other.

Further, the buffer layer according to this embodiment is a polycrystalline layer whose crystalline orientation is aligned in the c-axis direction in the direction perpendicular to the surface of the buffer layer and has higher crystallinity than the stack of oxide semiconductor layers.

One embodiment of the present invention is not limited to a top gate structure an example of which is described in this embodiment, and may have a structure in which gate electrode layers are provided above and below a stack of oxide semiconductor layers provided therebetween.

In addition, this embodiment can be freely combined with Embodiment 1 or Embodiment 2. For example, deposition can be performed twice to form a stack of oxide semiconductor layers having c-axis orientation according to this embodiment, and the stack of oxide semiconductor layers can be used as the oxide semiconductor layer in Embodiment 1. For further example, the stack of oxide semiconductor layers formed by performing deposition twice according to this embodiment may be used as the oxide semiconductor layer in Embodiment 2, and the oxide semiconductor layer 205 may be left in the entire pixel region.

Embodiment 4

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic appliances having the display device described in the above embodiment are described.

Figure 7A:
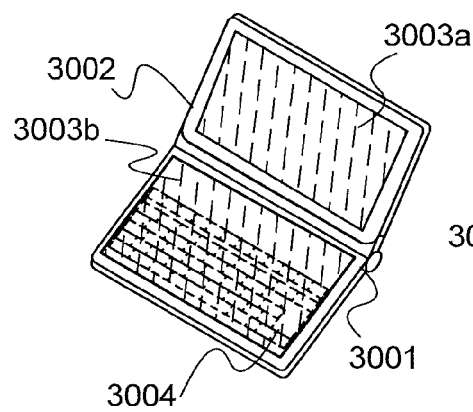
FIGS. 7A to 7C illustrate embodiments of an electronic appliance.

FIG. 7A illustrates a portable information terminal, which includes a main body 3001, a housing 3002, display portions 3003a and 3003b, and the like. The display portion 3003b functions as a touch panel; keyboard buttons 3004 displayed on the display portion 3003b is touched to operate a screen or input text. Needless to say, the display portion 3003a may function as a touch panel. A liquid crystal panel or an organic light-emitting panel is manufactured using the semiconductor device described in Embodiment 1 as a switching element and is applied to the display portion 3003a or 3003b, whereby a highly reliable portable information terminal can be provided.

The portable information terminal illustrated in FIG. 7A can be equipped with a function of displaying various kinds of data (e.g., a still image, a moving image, and a text image), a function of displaying a calendar, a date, the time, or the like on the display portion, a function of operating or editing the data displayed on the display portion, a function of controlling processing by various kinds of software (programs), and the like. Further, an external connection terminal (an earphone terminal, a USB terminal, or the like), a recording medium insertion portion, or the like may be provided on the rear surface or the side surface of the housing.

The portable information terminal illustrated in FIG. 7A may be equipped with a function capable of transmitting and receiving data wirelessly. Through wireless communication, book data or the like can be purchased and downloaded from an electronic book server, for example.

Figure 7B:
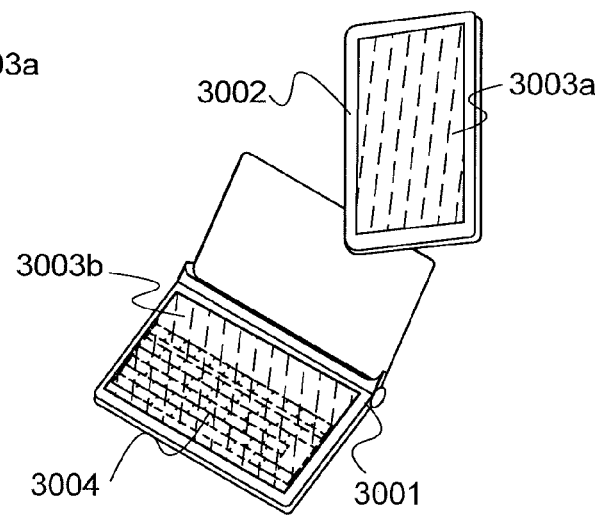

Further, one of the two display portions 3003a and 3003b of the portable information terminal illustrated in FIG. 7A can be detached, for example, as shown in FIG. 7B. The display portion 3003a can be equipped with a function as a touch panel, which contributes to a further reduction in weight when carried around and to the convenience since operation can be performed by one hand while supporting the housing 3002 by the other hand.

Further, the housing 3002 shown in FIG. 7B may be equipped with an antenna, a microphone function, or a wireless function to be used as a mobile phone.

Figure 7C:
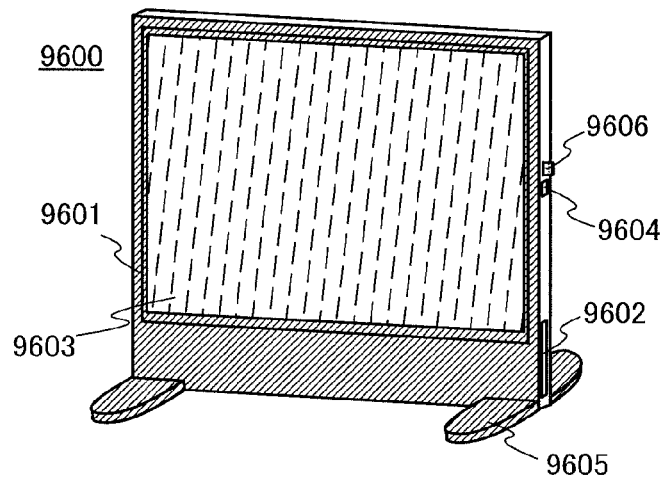

FIG. 7C illustrates an example of a television set. In a television set 9600, a display portion 9603 is incorporated in a housing 9601. Images can be displayed on the display portion 9603. In FIG. 7C, the housing 9601 is supported on a stand 9605 provided with a CPU. The semiconductor device described in Embodiment 1 is applied to the display portion 9603, whereby the television set 9600 with high reliability can be provided.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the receiver, general television broadcasting can be received. Moreover, the television set 9600 can be connected to a communication network with or without wires via the modem, whereby one-way (from sender to receiver) or two-way (between sender and receiver or between receivers) data communication can be performed.

Further, the television set 9600 is provided with an external connection terminal 9604, a storage medium recording and reproducing portion 9602, and an external memory slot. The external connection terminal 9604 can be connected to various types of cables such as a USB cable, which enables data communication with a personal computer or the like. A disk storage medium can be inserted into the storage medium recording and reproducing portion 9602, whereby data stored in the storage medium can be read and data can be written into the storage medium. In addition, a picture, a video, or the like stored as data in an external memory 9606 inserted to the external memory slot can be displayed on the display portion 9603.

The structures and methods described in this embodiment can be combined as appropriate with any of the structures and methods described in the other embodiments.

This application is based on Japanese Patent Application serial no. 2010-248840 filed with Japan Patent Office on Nov. 5, 2010, the entire contents of which are hereby incorporated by reference.

What is claimed is:

1. A semiconductor device comprising:
   an oxide semiconductor layer;
   a first buffer layer and a second buffer layer in contact with the oxide semiconductor layer;
   a source electrode layer and a drain electrode layer overlapping with the oxide semiconductor layer with the first buffer layer and the second buffer layer provided therebetween, respectively;
   a gate insulating layer in contact with the oxide semiconductor layer; and
   a gate electrode layer overlapping with the oxide semiconductor layer with the gate insulating layer provided therebetween,
   wherein the gate electrode layer has a stacked-layer structure,
   wherein one layer of the stacked-layer structure, whose surface is in contact with the gate insulating layer, is a first metal oxide containing nitrogen, and
   wherein each of the first buffer layer and the second buffer layer is a second metal oxide containing nitrogen.

2. The semiconductor device according to claim 1, wherein the first buffer layer and the second buffer layer extend beyond a side surface of the source electrode layer and a side surface of the drain electrode layer in a channel length direction, respectively.

3. The semiconductor device according to claim 1, wherein light transmittances of the first buffer layer and the second buffer layer are lower than a light transmittance of the oxide semiconductor layer.

4. The semiconductor device according to claim 1, wherein the first metal oxide is the same material as the second metal oxide.

5. The semiconductor device according to claim 1, wherein the second metal oxide comprises a material containing at least indium, oxygen, and nitrogen.

6. The semiconductor device according to claim 1, wherein an another layer of the gate electrode layer comprises a material containing aluminum or copper.

7. The semiconductor device according to claim 1, wherein at least part of the oxide semiconductor layer comprises a crystelline region having c-axis alignment in a direction substantially perpendicular to a surface of the oxide semiconductor layer.

8. The semiconductor device according to claim 1, wherein the first buffer layer and the second buffer layer comprise polycrystalline.

9. The semiconductor device according to claim 1, wherein the stacked-layer structure includes three layers.

10. A semiconductor device comprising:
an oxide semiconductor layer;
a first buffer layer and a second buffer layer in contact with the oxide semiconductor layer;
a source electrode layer and a drain electrode layer overlapping with the oxide semiconductor layer with the first buffer layer and the second buffer layer provided therebetween, respectively;
a gate insulating layer in contact with the oxide semiconductor layer; and
a gate electrode layer overlapping with the oxide semiconductor layer with the gate insulating layer provided therebetween,
wherein the gate electrode layer has a stacked-layer structure,
wherein one layer of the stacked-layer structure, whose surface is in contact with the gate insulating layer, is a first metal oxide containing nitrogen,
wherein each of the first buffer layer and the second buffer layer is a second metal oxide containing nitrogen, and
wherein the surface is a top surface.

11. The semiconductor device according to claim 10, wherein the first buffer layer and the second buffer layer extend beyond a side surface of the source electrode layer and a side surface of the drain electrode layer in a channel length direction, respectively.

12. The semiconductor device according to claim 10, wherein light transmittances of the first buffer layer and the second buffer layer are lower than a light transmittance of the oxide semiconductor layer.

13. The semiconductor device according to claim 10, wherein the first metal oxide is the same material as the second metal oxide.

14. The semiconductor device according to claim 10, wherein the second metal oxide comprises a material containing at least indium, oxygen, and nitrogen.

15. The semiconductor device according to claim 10, wherein an another layer of the gate electrode layer comprises a material containing aluminum or copper.

16. The semiconductor device according to claim 10, wherein at least part of the oxide semiconductor layer comprises a crystalline region having c-axis alignment in a direction substantially perpendicular to a surface of the oxide semiconductor layer.

17. The semiconductor device according to claim 10, wherein the first buffer layer and the second buffer layer comprise polycrystalline.

18. The semiconductor device according to claim 10, wherein the stacked-layer structure includes three layers.

19. A semiconductor device comprising:
an oxide semiconductor layer;
a first buffer layer and a second buffer layer in contact with the oxide semiconductor layer;
a source electrode layer and a drain electrode layer overlapping with the oxide semiconductor layer with the first buffer layer and the second buffer layer provided therebetween, respectively;
a gate insulating layer in contact with the oxide semiconductor layer; and
a gate electrode layer overlapping with the oxide semiconductor layer with the gate insulating layer provided therebetween,
wherein the gate electrode layer has a stacked-layer structure,
wherein one layer of the stacked-layer structure, whose surface is in contact with the gate insulating layer, is a first metal oxide containing nitrogen,
wherein each of the first buffer layer and the second buffer layer is a second metal oxide containing nitrogen,
wherein the surface is a bottom surface.

20. The semiconductor device according to claim 19, wherein the first buffer layer and the second buffer layer extend beyond a side surface of the source electrode layer and a side surface of the drain electrode layer in a channel length direction, respectively.

21. The semiconductor device according to claim 19, wherein light transmittances of the first buffer layer and the second buffer layer are lower than a light transmittance of the oxide semiconductor layer.

22. The semiconductor device according to claim 19, wherein the first metal oxide is the same material as the second metal oxide.

23. The semiconductor device according to claim 19, wherein the second metal oxide comprises a material containing at least indium, oxygen, and nitrogen.

24. The semiconductor device according to claim 19, wherein an another layer of the gate electrode layer comprises a material containing aluminum or copper.

25. The semiconductor device according to claim 19, wherein at least part of the oxide semiconductor layer comprises a crystalline region having c-axis alignment in a direction substantially perpendicular to a surface of the oxide semiconductor layer.

26. The semiconductor device according to claim 19, wherein the first buffer layer and the second buffer layer comprise polycrystalline.

27. The semiconductor device according to claim 19, wherein the stacked-layer structure includes three layers.

28. The semiconductor device according to claim 1, wherein the oxide semiconductor layer comprises indium, gallium and zinc.

29. The semiconductor device according to claim 10, wherein the oxide semiconductor layer comprises indium, gallium and zinc.

30. The semiconductor device according to claim 19, wherein the oxide semiconductor layer comprises indium, gallium and zinc.

31. A semiconductor device comprising:
an oxide semiconductor layer;
a gate electrode layer overlapping with the oxide semiconductor layer; and
a gate insulating layer between the oxide semiconductor layer and the gate electrode layer,
wherein the gate electrode layer comprises a first layer and a second layer,
wherein the first layer comprises a metal element, oxygen, and nitrogen,
wherein the second layer comprises copper, and wherein the first layer, the second layer, and the oxide semiconductor layer overlap with one another.

32. The semiconductor device according to claim 31, wherein the metal element is indium.

33. The semiconductor device according to claim 31, wherein at least part of the oxide semiconductor layer comprises a crystalline region having c-axis alignment in a direction substantially perpendicular to a surface of the oxide semiconductor layer.

34. The semiconductor device according to claim 31, wherein the oxide semiconductor layer comprises indium, gallium and zinc.

35. The semiconductor device according to claim 31, wherein the gate electrode layer is provided under the oxide semiconductor layer.

36. A semiconductor device comprising:
an oxide semiconductor layer;
a source electrode layer electrically connected to the oxide semiconductor layer;
a drain electrode layer electrically connected to the oxide semiconductor layer;
a first buffer layer between the oxide semiconductor layer and the source electrode layer;
a second buffer layer between the oxide semiconductor layer and the drain electrode layer;
a gate electrode layer overlapping with the oxide semiconductor layer; and
a gate insulating layer between the oxide semiconductor layer and the gate electrode layer,
wherein each of the first buffer layer and the second buffer layer comprises a metal element, oxygen, and nitrogen, and
wherein the gate electrode layer comprises a metal element, oxygen, and nitrogen.

37. The semiconductor device according to claim 36, wherein the metal element comprised in each of the first buffer layer and the second buffer layer is indium.

38. The semiconductor device according to claim 36, wherein the gate electrode layer comprises:
a first layer comprising a metal element, oxygen, and nitrogen; and
a second layer comprising one of aluminum and copper,
wherein the first layer and the second layer overlap with each other.

39. The semiconductor device according to claim 36, wherein at least part of the oxide semiconductor layer comprises a crystalline region having c-axis alignment in a direction substantially perpendicular to a surface of the oxide semiconductor layer.

40. The semiconductor device according to claim 36, wherein the gate electrode layer is provided under the oxide semiconductor layer.

41. The semiconductor device according to claim 36, wherein the oxide semiconductor layer comprises indium, gallium and zinc.

* * * * *

UNITED STATES PATENT AND TRADEMARK OFFICE
CERTIFICATE OF CORRECTION

| | | |
|---|---|---|
| PATENT NO. | : 8,569,754 B2 | Page 1 of 1 |
| APPLICATION NO. | : 13/285385 | |
| DATED | : October 29, 2013 | |
| INVENTOR(S) | : Shunpei Yamazaki et al. | |

It is certified that error appears in the above-identified patent and that said Letters Patent is hereby corrected as shown below:

In the Specification

Column 6, line 67, replace "seem" with --sccm--;

Column 7, line 3, replace "seem" with --sccm--;

Column 7, line 30, replace "pin" with --μm--;

Column 9, line 22, replace "seem" with --sccm--;

In the Claims

Column 19, line 9, in claim 7, replace "crystelline" with --crystalline--.

Signed and Sealed this
Eighteenth Day of March, 2014

Michelle K. Lee
*Deputy Director of the United States Patent and Trademark Office*